United States Patent [19]
Seo et al.

[11] Patent Number: 6,044,534
[45] Date of Patent: Apr. 4, 2000

[54] SEMICONDUCTOR DEVICE MANUFACTURING MACHINE AND METHOD FOR MANUFACTURING A SEMICONDUCTOR DEVICE BY USING THE SAME MANUFACTURING MACHINE

[75] Inventors: Hirofumi Seo; Shinichi Hiramatsu, both of Tokyo, Japan

[73] Assignee: NEC Corporation, Tokyo, Japan

[21] Appl. No.: 08/761,833

[22] Filed: Dec. 9, 1996

[30] Foreign Application Priority Data

Dec. 7, 1995 [JP] Japan .................................. 7-319000

[51] Int. Cl.⁷ ...................................... B21F 41/00
[52] U.S. Cl. ............................................ 29/28.01
[58] Field of Search .......................... 118/503; 29/25.01; 414/935–941

[56] References Cited

U.S. PATENT DOCUMENTS

| | | |
|---|---|---|
| 4,344,383 | 8/1982 | Salt, Jr. . |
| 4,931,135 | 6/1990 | Horiuchi et al. . |
| 5,262,029 | 11/1993 | Erskine et al. . |
| 5,421,401 | 6/1995 | Sherstinsky et al. . |
| 5,437,757 | 8/1995 | Rice et al. . |
| 5,456,756 | 10/1995 | Ramaswami et al. . |
| 5,556,500 | 9/1996 | Hasegawa et al. . |
| 5,725,718 | 3/1998 | Banholzer et al. . |

FOREIGN PATENT DOCUMENTS 62-128122  6/1987  Japan .
2130819   5/1990  Japan .

OTHER PUBLICATIONS

T. Oomi, "Ultra–clean ULSI Technology," Dec. 15, 1995, pp. 91–96.

*Primary Examiner*—David E. Graybill
*Attorney, Agent, or Firm*—Sughrue, Mion, Zinn Macpeak & Seas, PLLC

[57] ABSTRACT

A semiconductor device manufacturing machine comprises a mechanism provided in a processing chamber, for lifting up a ring-like peripheral member, and a holder provided at a tip end of a feeding mechanism located in a feeding chamber, and capable of holding either or both a semiconductor wafer and the ring-like peripheral member, so that, in the processing chamber maintained in a vacuum condition, the ring-like peripheral member is lifted up by the lifting mechanism and transferred to the holder of the feeding mechanism, and the ring-like peripheral member held by the holder of the feeding mechanism is moved from the processing chamber through the feeding chamber to a load lock chamber and further can be removed from of the semiconductor device manufacturing machine. Thus, the ring-like peripheral member is held and transferred by the holder for holding and transferring the semiconductor wafer, and therefore, the ring-like peripheral member can be exchanged without breaking the vacuum condition of the processing chamber.

3 Claims, 14 Drawing Sheets

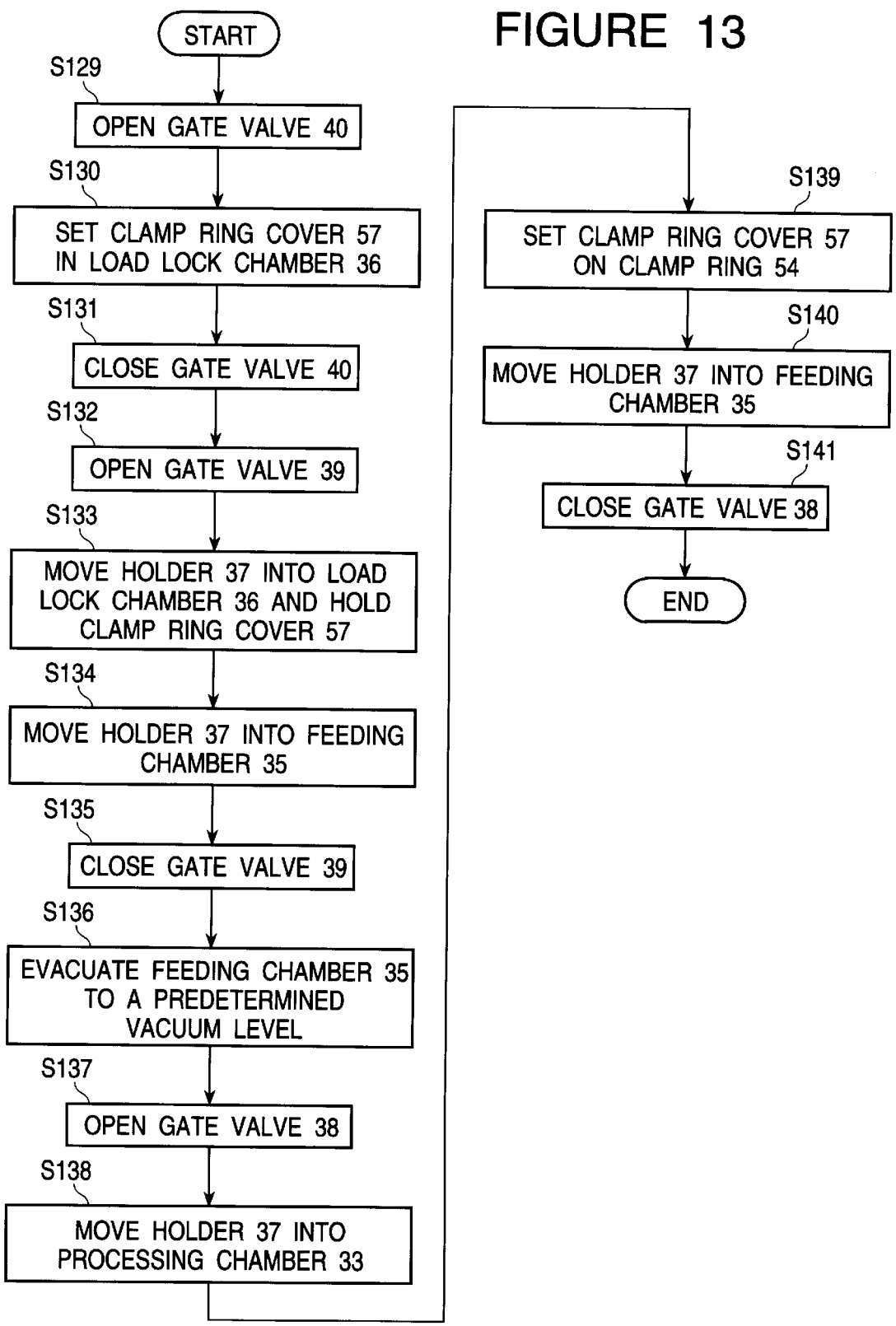

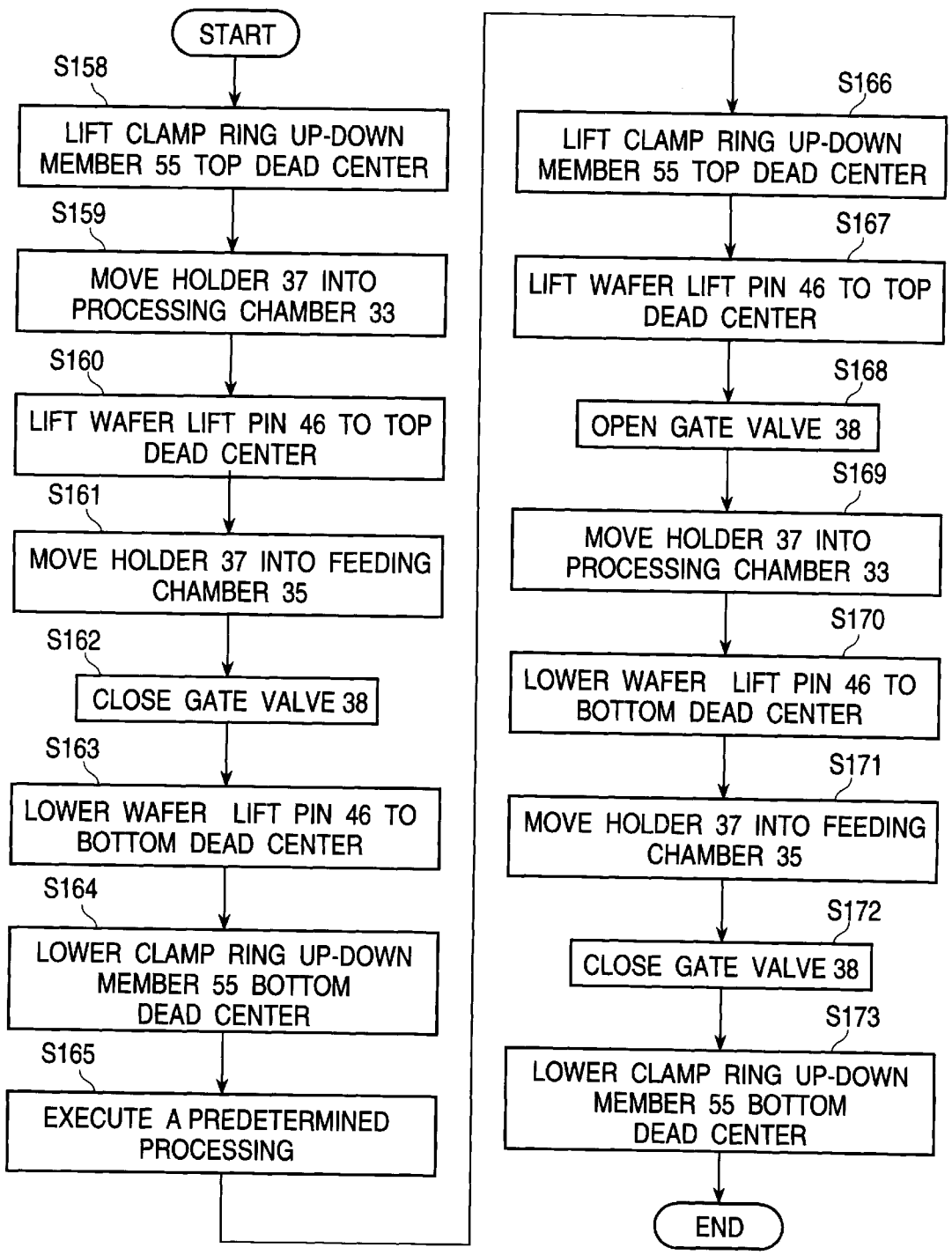

SEMICONDUCTOR DEVICE MANUFACTURING MACHINE AND METHOD FOR MANUFACTURING A SEMICONDUCTOR DEVICE BY USING THE SAME MANUFACTURING MACHINE

BACKGROUND OF THE INVENTION

1. Field of the Invention

The present invention relates to a semiconductor device manufacturing machine and a method for manufacturing a semiconductor device by using the same manufacturing machine, and more specifically to a vacuum processing apparatus.

2. Description of Related Art

Referring to FIG. 1, there is shown a diagrammatic view illustrating a construction of a semiconductor device manufacturing machine. The shown machine includes a processing chamber 73 in which a predetermined processing is conducted on a semiconductor wafer 100 put on a stage 72 under low pressure, a load lock chamber 76 for loading the semiconductor wafer 100 to the manufacturing machine from an external source, and a feeding chamber 75 affixed in an air-tight manner between the processing chamber 73 and the load lock chamber 76 and having therein a feeding mechanism (manipulator) 74 for feeding the semiconductor wafer 100 to and removing it from a predetermined position within the processing chamber 73. The feeding chamber 75 is alternately put either in an atmospheric pressure or in a predetermined degree of vacuum. The feeding mechanism 74 has at its tip end a holder 77 for holding directly the semiconductor wafer 100 when the feeding mechanism 74 feeds the semiconductor wafer 100. Between the processing chamber 73 and the feeding chamber 75, there is provided a gate valve 78 for partitioning and sealing in an air-tight manner the processing chamber 73 from the feeding chamber 75. Between the feeding chamber 75 and the load lock chamber 76, there is provided another gate valve 79 for partitioning and sealing in an air-tight manner the feeding chamber 75 from the load lock chamber 76. Furthermore, the load lock chamber 76 has still another gate valve 79 for partitioning sealing in an air-tight manner the load lock chamber 76 from a space external to the machine.

Now, operation of the above mentioned semiconductor device manufacturing machine, namely, a method for manufacturing the semiconductor device by using the above mentioned semiconductor device manufacturing machine, will be described.

First, the gate valve 80 is opened, and a semiconductor wafer 100 is set in the load lock chamber 76 at the atmospheric pressure. Thereafter, the gate valve 80 is closed, and then, the gate valve 79 is opened, so that the feeding chamber 75 which was at a predetermined vacuum level, becomes the same pressure as that of the load lock chamber 76, namely near to the atmospheric pressure. In this condition, the feeding mechanism 74 is operated to hold the semiconductor wafer 100 in the load lock chamber 76 by the holder 77 and to move it into the feeding chamber 75.

Thereafter, the gate valve 79 is closed, and the feeding chamber 75 is evacuated to the predetermined vacuum level. Then, the gate valve 78 is opened, and the feeding mechanism 74 is operated again, to move the semiconductor wafer 100 held by the holder 77, into the processing chamber 73, and to put the same on the stage 72. After the semiconductor wafer 100 is put on the stage 72, the holder 77 is retracted into the feeding chamber 75, and then, the gate valve 78 is closed. Thus, a loading operation of the semiconductor wafer is completed, and a predetermined processing is carried out to the semiconductor wafer 100. If the predetermined processing is completed, the processed semiconductor wafer 100 is removed from the processing chamber 73 through the feeding chamber 76 and the load lock chamber 76 by an unloading operation in which respective steps of the above mentioned loading operation of the semiconductor wafer are conducted in inverse order.

Next, a detail of the processing chamber 73 and a wafer handling sequence carried out within the processing chamber 73 will be described with reference to FIGS. 2 and 3, which diagrammatically illustrate a parallel plate type, single-wafer-processing type dry etching machine, which is one type of semiconductor device manufacturing machine.

As shown in FIG. 2, the processing chamber 73 includes an upper electrode 81 and a lower electrode 82 for generating plasma therebetween, the stage 72 provided at the side of the lower electrode 82 and for supporting the semiconductor wafer 100 when the semiconductor wafer 100 is etched, a compensating ring 83 provided on a lower surface of the upper electrode 81 and formed to extend toward a periphery of the semiconductor wafer 100 for the purpose of compensating evenness in etching of the semiconductor wafer 100, and a plurality of lift pins 84 which can be vertically moved up and down in order to locate the semiconductor wafer 100 on the stage 72 and to maintain the semiconductor wafer 100 at a predetermined height from an upper surface of the stage 72 when the semiconductor wafer 100 is to be removed from the stage 72. The above mentioned construction is disclosed in for example Japanese Patent Application Laid-open Publication No. JP-A-62-128122.

On the other hand, as shown in FIG. 3, the holder 77 includes holding guides 771 for preventing the semiconductor wafer 100 put on the holder 77 from deviating from a proper position.

At the time of placing the semiconductor wafer 100 on the stage 72, the lift pins 84 are lifted to a top dead center, and in this condition, the holder 77 holding the semiconductor wafer 100 between the holding guides 771 is moved to a position directly above the stage 72. Then, the holder 77 is lowered until the semiconductor wafer 100 is placed on the lift pins 84 and an upper surface of the holder 77 becomes lower than an lower surface of the semiconductor wafer 100.

Thereafter, the holder 77 is retracted into the feeding chamber 75 from the position directly above the stage 72 within the processing chamber 73, and the lift pins 84 are lowered to a bottom dead center. Thus, the semiconductor wafer 100 is placed on the stare 72.

In the above operation, the holder 77 and the lift pins 84 are located not to interfere with each other. In addition, at the time of removing the semiconductor wafer 100 from the stage 72, respective steps of the above mentioned operation for placing the semiconductor wafer 100 on the stage 72, are conducted in inverse order.

As another example different from the above mentioned example, a chemical vapor deposition (CVD) machine, which is another type of semiconductor device manufacturing machine, comprises a holding plate for holding a semiconductor wafer, and another separate and removable holding plate configured to cover a periphery of the semiconductor wafer. This construction is disclosed by for example Japanese Patent Application Laid-open Publication No. JP-A-2-130819.

At the time of carrying out a predetermined chemical vapor deposition on the semiconductor wafer, the semiconductor wafer is placed on the holding plate. At this time, the vapor deposition occurs not only on the semiconductor wafer but also on the removable holding plate covering the periphery of the semiconductor wafer. As a result, a reaction product film deposited on the removable holding plate becomes particles, which adhere to the semiconductor wafer, with the result that the production yield of the manufacturing machine drops. Therefore, the removable holding plate is periodically exchanged with a new one.

In the above mentioned conventional semiconductor device manufacturing machines and the methods for manufacturing the semiconductor device by using the manufacturing machines, reaction products deposit on or adhere to a peripheral member located at the periphery of the semiconductor wafer in the processing chamber (for example, the compensating ring in the parallel plate type, single-wafer-processing type dry etching machine and the holding plate in the chemical vapor deposition machine), or alternatively, the peripheral member itself is etched. Therefore, it is necessary to clean or exchange the peripheral member by bringing the processing chamber maintained in a vacuum condition, into an atmospheric pressure.

Specifically, in the parallel plate type, single-wafer-processing type dry etching machine, the peripheral member, namely, the compensating ring is exposed to a plasma atmosphere, and therefore, is etched so that a shape of the compensating ring is damaged or lost. As a result, the compensating ring, which had properly compensated a plasma distribution, can no longer properly compensate the plasma distribution after being used for a certain length of time. The evenness of etching to the semiconductor wafer is deteriorated, and therefore, the yield of production in the semiconductor device manufacturing machine drops. Accordingly, in order to prevent this drawback, it is necessary to replace the compensating ring which was used for a certain length of time, by a new one.

On the other hand, in the case in which a surface temperature of the compensating ring is lower than that of the other portions in order to obtain a desired process performance and a plasma atmosphere uses a gas apt to cause deposition (for example, $CHF_3$), deposition occurs on the surface of the compensating ring. However, it is impossible to completely prevent this deposition, even if there exists a method of reducing the deposition. As a result, a thickened deposition peels off from the compensating ring and adheres to the semiconductor wafer surface. Thus, the yield of production in the semiconductor device manufacturing machine drops. In this case, similarly, it is necessary to replace the compensating ring which was used for a certain length of time, by a new one, or to provide a means for removing the deposition.

Furthermore, in the chemical vapor deposition machine or a sputtering machine, as mentioned above, deposition occurs not only on the semiconductor wafer but also on the holding plate located in proximity of the semiconductor wafer, so that the thickness of the holding plate increases, with the result that a thickness of the film deposited on a peripheral region of the semiconductor wafer becomes smaller than that of the film deposited on a center region of the semiconductor wafer. Namely, the evenness of the thickness of the deposited film is deteriorated. In addition, the film deposited on the holding plate drops on the semiconductor wafer surface in the form of particles. Thus, even in this case, the yield of production in the semiconductor device manufacturing machine drops. Accordingly, it is necessary to periodically remove the deposition or to periodically exchange the holding plate.

However, in order to exchange a component or clean the component, it is necessary that, before the exchange or cleaning of the component, the processing chamber which was maintained at a predetermined vacuum level is brought into an atmospheric pressure, and after the exchange or cleaning of the component is completed, the processing chamber is returned to the predetermined vacuum level, again. This lowers an operating efficiency of the manufacturing machine.

SUMMARY OF THE INVENTION

Accordingly, it is an object of the present invention to provide a semiconductor device manufacturing machine, which has overcome the above mentioned deficiencies of the conventional ones.

Another object of the present invention is to provide a semiconductor device manufacturing machine having an elevated operating efficiency.

Still another object of the present invention is to provide a method for manufacturing a semiconductor device by using the above mentioned semiconductor device manufacturing machine.

The above and other objects of the present invention are achieved in accordance with the present invention by a semiconductor device manufacturing machine comprising a processing chamber for processing a semiconductor wafer, one (singly) by one, under a low pressure, a feeding chamber coupled to the processing chamber, a load lock chamber coupled to the feeding chamber, a feeding mechanism provided in and integral to the feeding chamber for feeding the semiconductor wafer between the processing chamber and the load lock chamber, a semiconductor wafer lift-up mechanism provided in the processing chamber, for lifting up the semiconductor wafer placed in a predetermined position within the processing chamber, a ring-like peripheral member provided in the processing chamber and located near to a periphery of the semiconductor wafer placed in the predetermined position within the processing chamber, a ring-like peripheral member lift-up mechanism provided in the processing chamber, for lifting up the peripheral member, and a holding member provided at a tip end of the feeding mechanism and capable of holding either or both of the semiconductor wafer and the peripheral member, whereby the ring-like peripheral member is lifted up by the peripheral member lift-up mechanism and then is placed on the holding member so that the peripheral member can be taken out by the feeding mechanism to the load lock chamber and then to a space external to the semiconductor device manufacturing machine.

In one embodiment, the semiconductor device manufacturing machine is a parallel plate, single-wafer-processing type dry etching machine, and the peripheral member is a compensating ring for compensating the evenness of etching In another embodiment, the semiconductor device manufacturing machine is a sputtering machine or a chemical vapor deposition machine, and the peripheral member is a clamp ring cover provided to cover an upper surface of a clamp ring which is used to fix the semiconductor wafer placed in the predetermined position within the processing chamber.

According to another aspect of the present invention, there is provided a method for manufacturing a semiconductor device by using the above mentioned semiconductor device manufacturing machine, the method comprising the step of placing the peripheral member within the load lock chamber when the load lock chamber is at an atmospheric pressure, the step of placing the peripheral member on the holding member and feeding the peripheral member into the feeding chamber, the step of waiting until the feeding chamber reaches a predetermined vacuum level, and the step of feeding the peripheral member to the predetermined position within the processing chamber and placing the peripheral member on the predetermined position.

As seen from the above, the present invention is characterized in that the holding member for holding the semiconductor wafer is configured to further hold the peripheral member. Therefore, at the time of exchanging the peripheral member within the processing chamber which is maintained at a vacuum level, the peripheral member can be exchanged from outside of the manufacturing machine, without bringing the processing chamber to the atmospheric pressure.

The above and other objects, features and advantages of the present invention will be apparent from the following description of preferred embodiments of the invention with reference to the accompanying drawings.

BRIEF DESCRIPTION OF THE DRAWINGS

FIG. 13 is a flow chart illustrating a process for setting a clamp ring cover, in a second embodiment of the semiconductor device manufacturing method in accordance with the present invention;

FIG. 17 is a flow chart illustrating a process for processing the semiconductor wafer, in the second embodiment of the semiconductor device manufacturing method in accordance with the present invention.

DESCRIPTION OF THE PREFERRED EMBODIMENTS

Now, embodiments of the semiconductor device manufacturing machine in accordance with the present invention and the semiconductor device manufacturing method in accordance with the present invention using the semiconductor device manufacturing machine in accordance with the present invention will be described with reference to the accompanying drawings.

EMBODIMENT 1

Figure 1:
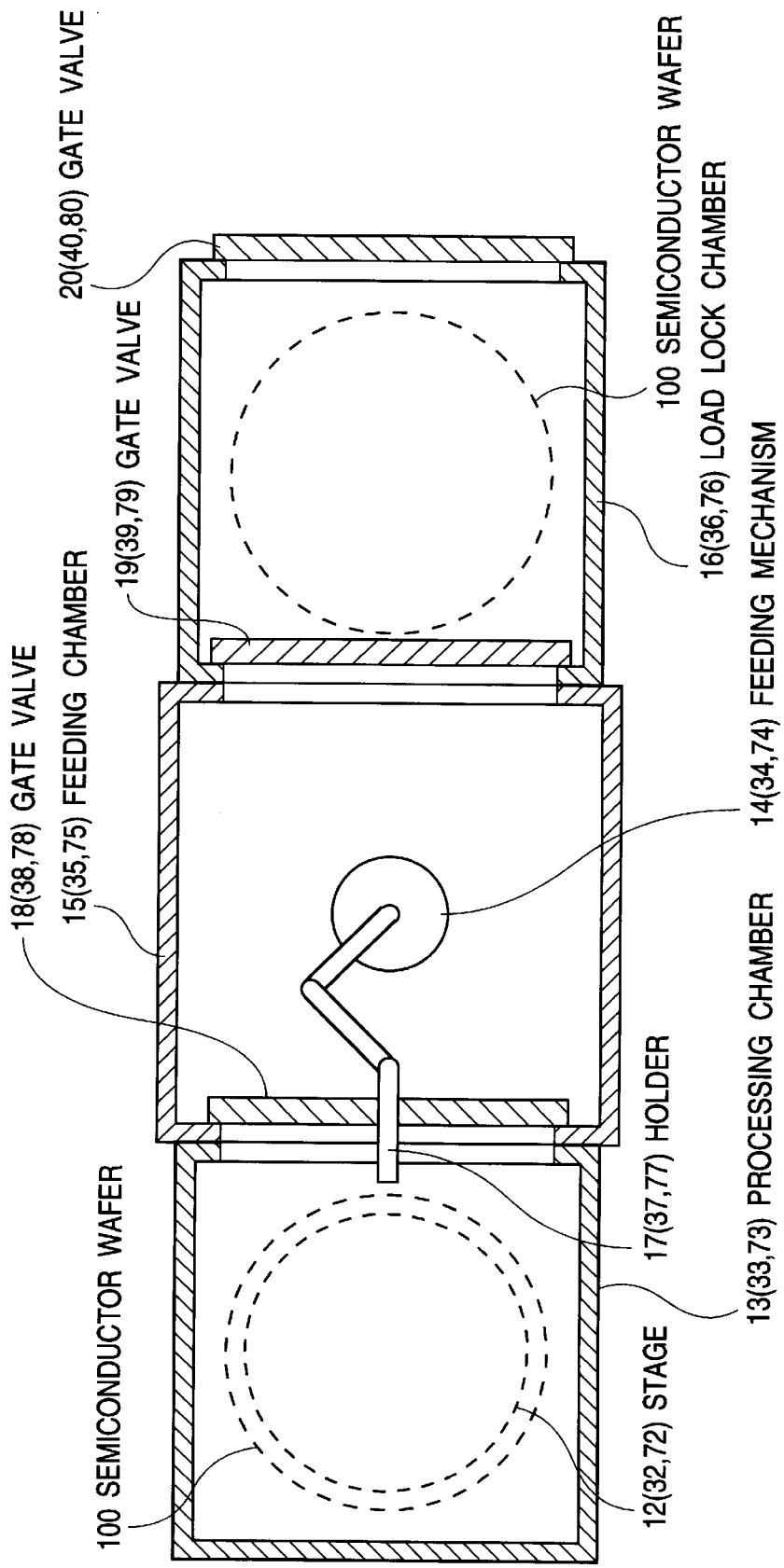
FIG. 1 is a diagrammatic view illustrating a construction of a semiconductor device manufacturing machine.

A first embodiment of the semiconductor device manufacturing machine in accordance with the present invention is that the present invention is applied to a parallel plate type, single-wafer-processing type, dry etching machine. Therefore, an overall construction of this embodiment is similar to that of the example shown in FIG. 1, and therefore, in place of a drawing showing the overall construction of this embodiment, new Reference Numerals for showing the overall construction of this embodiment are added to FIG. 1.

Figure 2:
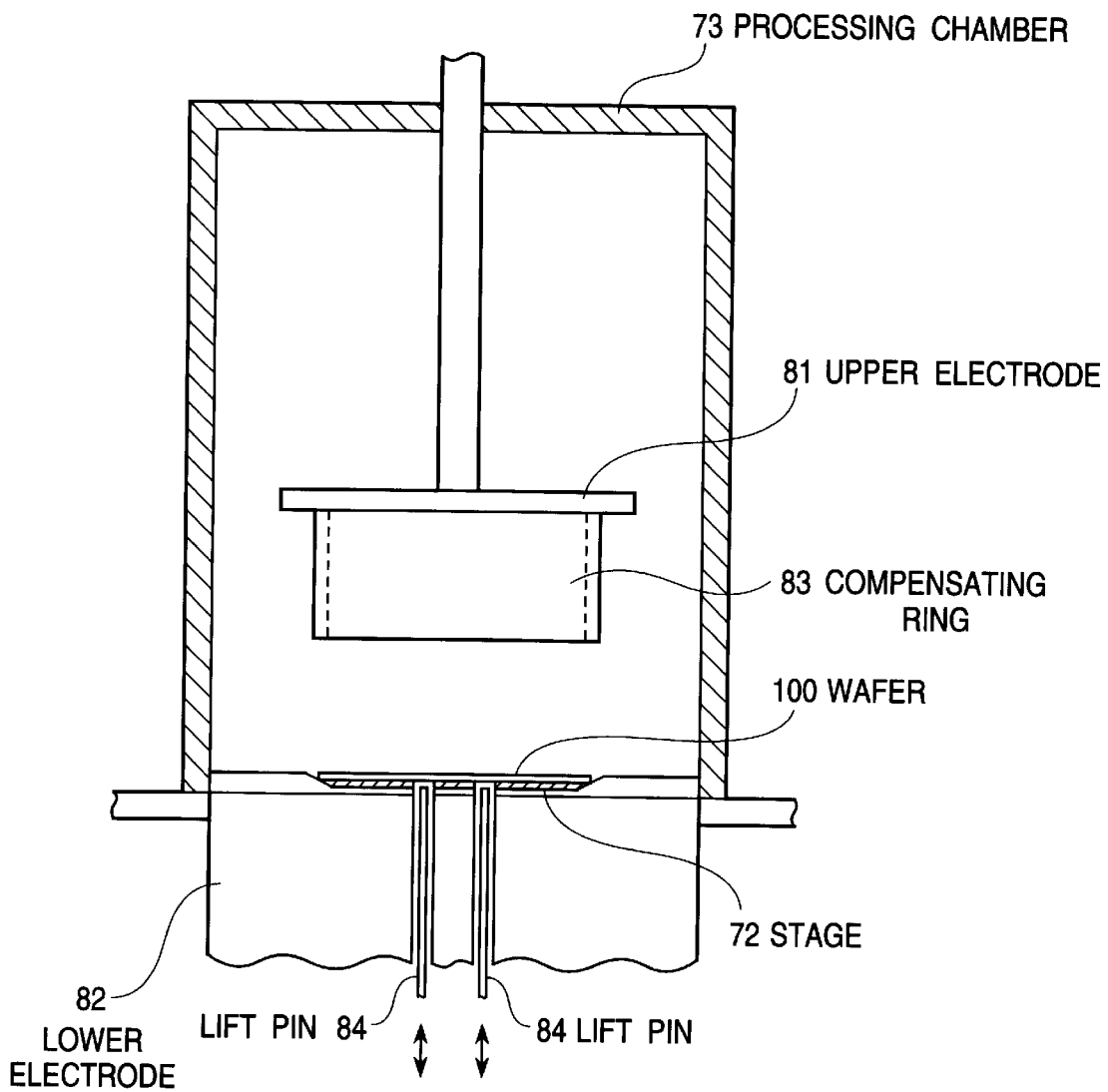
FIG. 2 is a diagrammatic sectional view of the processing chamber of a conventional, parallel plate type, a single-wafer-processing type dry etching machine.
Figure 3:
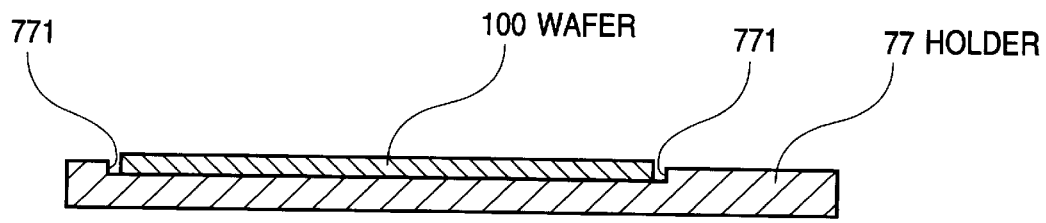
FIG. 3 is a diagrammatic sectional view of the holder provided to the feeding mechanism in the conventional semiconductor device manufacturing machine.

Namely, the first embodiment includes a stage 12, a processing chamber 13, a feeding mechanism 14, a feeding chamber 15, a load lock chamber 16, a holder 17 and gate valves 18 to 20, which are similar to corresponding ones of the prior art example. However, as shown in FIGS. 4 and 5, the processing chamber 13 and the holder 17 are different in a detailed construction from those of the processing chamber 73 and the holder 77 of the prior art shown in FIGS. 2 and 3.

Figure 4:
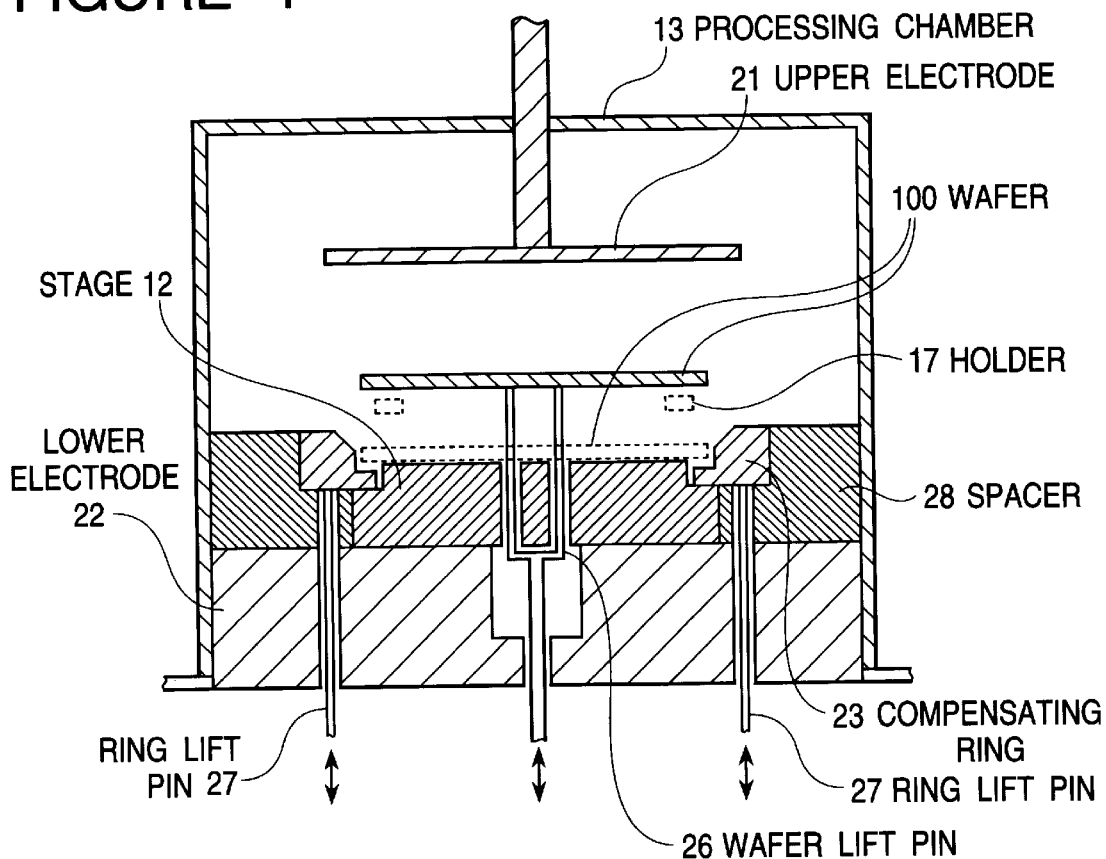
FIG. 4 is a diagrammatic sectional view of the processing chamber of a first embodiment of the semiconductor device manufacturing machine in accordance with the present invention.
Figure 5:
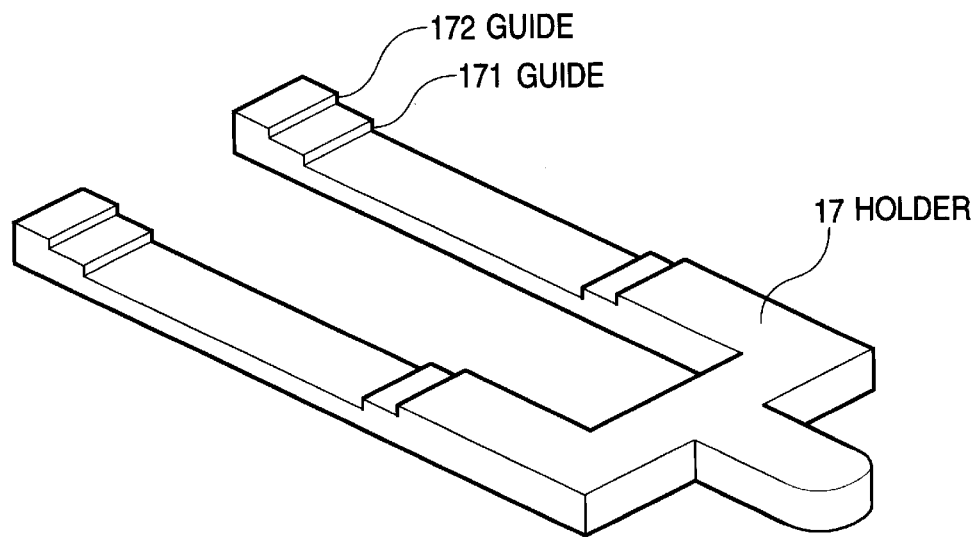
FIG. 5 is a diagrammatic perspective view of the holder provided to the feeding mechanism in the first embodiment of the semiconductor device manufacturing machine in accordance with the present invention.

The processing chamber 13 as shown in FIG. 4 is configured to carry out a predetermined dry etching to a semiconductor wafer 100 placed on the stage 12. An upper electrode 21 and a lower electrode 22 are located separately from each other in a vertical direction for generating a desired plasma therebetween. The stage 12 is put on the lower electrode 22 and is surrounded by a spacer 28 which is also put on the lower electrode 22. A compensating ring 23 is put in a recess formed on an upper surface of the stage 12 and the spacer 28, near to a periphery of the semiconductor wafer 100, for the purpose of adjusting a plasma distribution generated between the upper electrode 21 and the lower electrode 22, so as to increase evenness in etching of the semiconductor wafer 100. A plurality of semiconductor wafer lift pins 26 are provided to extend through the lower electrode 22 and the stage 12 so as to support the semiconductor wafer by their tip end, and are constructed to be vertically driven up and down in order to locate the semiconductor wafer 100 on the stage 12 (etching position) and to maintain the semiconductor wafer 100 at a predetermined height from an upper surface of the stage 12 (feeding position) when the semiconductor wafer 100 is to be put on or removed from the stage 12. Furthermore, a plurality of compensating ring lift pins 27 are also provided to extend through the lower electrode 22 and the spacer 28 so as to support the compensating ring 23 by their tip end, and are constructed to be vertically driven up and down in order to locate the compensating ring 23 on the stage 12 (etching position) and to maintain the compensating ring 23 at a predetermined height from an upper surface of the stage 12 (feeding position) when the compensating ring 23 is to be put on or removed from the stage 12.

The holder 17 is of a forked shape and is controlled by the feeding mechanism 14 to move horizontally between adjacent chambers. In addition, as shown in FIG. 5 the holder 17 includes semiconductor wafer holding guides 171 (which define a first recess) for preventing the semiconductor wafer 100 put on the holder 17 from deviating from a proper position, when the semiconductor wafer is held. The holder 17 also includes compensating ring holding guides 172 (which define a second recess which is shallower and larger than the first recess and which has a center axis common to the first recess) for preventing the compensating ring 23 put on the holder 17 from deviating from a proper position, when the compensating ring 23 is held. With this arrangement, the holder 17 simultaneously holds both the semiconductor wafer 100 and the compensating ring 23 by the guides while preventing these members from deviating from their respective proper positions.

In addition, when the holder 17 is located within the processing chamber 13, the holder 17 is controlled by the feeding mechanism to vertically move between a first level, in which an upper surface of the holder 17 is lower in height than the feeding position (top dead center) of the tip end of the semiconductor wafer lift pins 26 and the feeding position (top dead center) of the tip end of the compensating ring lift pins 27, and a second level, in which an under surface of the semiconductor wafer 100 or the compensating ring 23 placed on the holder 17 is higher in height than the feeding position (top dead center) of the tip end of the semiconductor wafer lift pins 26 and the feeding position (top dead center) of the tip end of the compensating ring lift pins 27.

Figure 6:
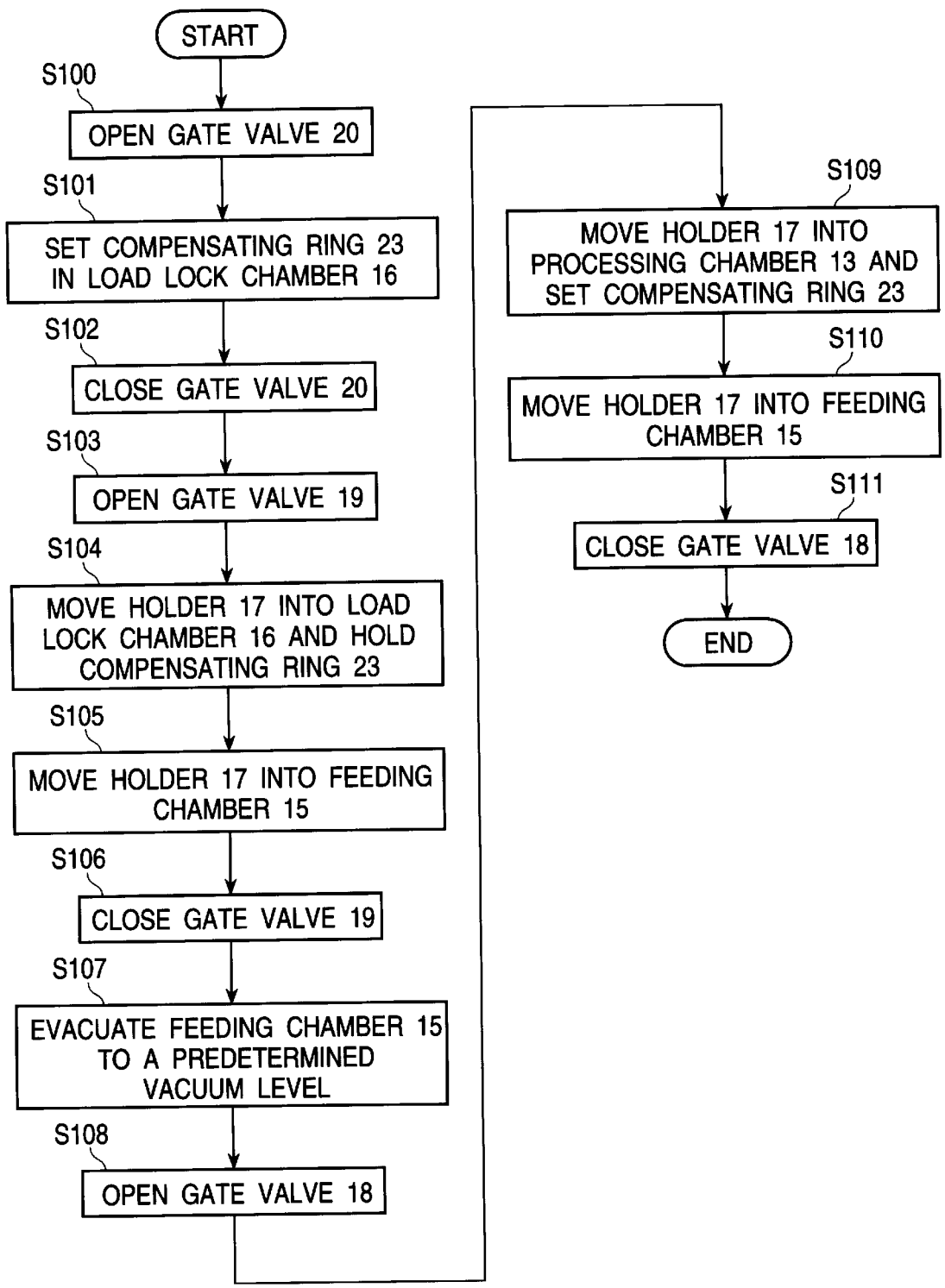
FIG. 6 is a flow chart illustrating a process for setting a compensating ring, in a first embodiment of the semiconductor device manufacturing method in accordance with the present invention.
Figure 7:
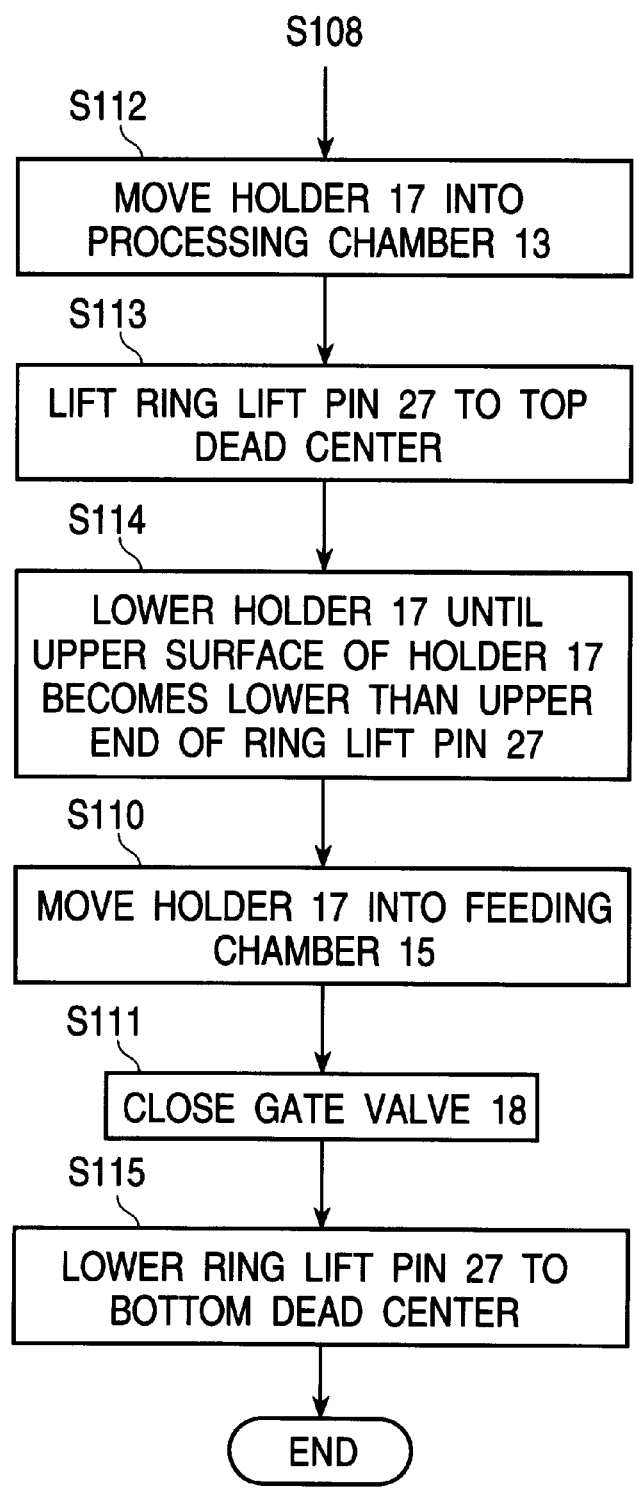
FIG. 7 is a detailed flow chart illustrating the process for setting the compensating ring.

Now, a process for setting the compensating ring 23, which is included in a first embodiment of the semiconductor device manufacturing method in accordance with the present invention, will be described with reference to FIGS. 1, 4, 5, 6 and 7. FIG. 6 is a flow chart illustrating the process for setting the compensating ring, and FIG. 7 is a detailed flow chart illustrating the process for setting the compensating ring.

The process for setting the compensating ring in the overall system of the manufacturing machine, is conducted as shown in FIG. 6. First, the gate valve 20 is opened (Step S100), and the compensating ring 23 to be mounted into the processing chamber is set within the load lock chamber 16 (Step S101). After the Step S101 is completed, the gate valve 20 is closed (Step S102), and then, the gate valve 19 is opened (Step S103). After the Step S103 is completed, the feeding mechanism 14 is controlled to move the holder 17 into the load lock chamber 16 and to handle the compensating ring 23 by the holder 17 (namely, to cause the compensating ring 23 to be held by or placed on the holder 17) (Step S104). The feeding mechanism 14 is further controlled to retract the holder 17 holding the compensating ring 23, into the feeding chamber 15 (Step S105).

Thereafter, the gate valve 19 is closed (Step S106), and then, the feeding chamber 15 is evacuated to a predetermined vacuum level (Step S107). After the Step S107 is completed, the gate valve 18 is opened (Step S108), and the feeding mechanism 14 is controlled to move the holder 17 into the processing chamber 13 and to set the compensating ring 23 supported by the holder 17, on a predetermined position (Step S109). Thereafter, the feeding mechanism 14 is further controlled to retract the holder 17 which had already released the compensating ring 23, into the feeding chamber 15 (Step S110). Then, the gate valve 18 is closed (Step S111). Thus, the setting of the compensating ring 23 is completed.

Now, a detailed operation from the Step S109 to the Step S111 will be described with reference to the flow chart of FIG. 7.

First, the holder 17 is moved into the processing chamber 13 (Step S112), and then, the compensating ring lift pins 27 are lifted up to the compensating ring delivery position (the top dead center) (Step S113). Furthermore, the holder 17 is lowered until the upper surface of the holder 17 becomes lower than the tip end of the compensating ring lift pins 27, with the result that the compensating ring held by the holder 17 has been delivered to the compensating ring lift pins 27 (Step S114). The holder 17 which no longer holds the compensating ring 23 is retracted into the feeding chamber 15 (Step S110) and the gate valve 18 is closed (Step S111). On the other hand, the compensating ring lift pins 27 are lowered at such a position (bottom dead center) that the tip end of the compensating ring lift pins 27 do not protrude from the upper surface of the stage 12 (Step S115), with the result that the compensating ring 23, which had been supported by the tip end of the compensating ring lift pins 27, is placed in a predetermined position within the processing chamber.

In the above mentioned operation, the Step S112 and the Step S113 can be executed in inverse order, and the Step S111 and the Step S115 can be also executed in inverse order. But, the order shown in flow chart of FIG. 7 is more preferable, since it is preferred to minimize the open time of the gate valve 18 from the viewpoint of maintaining the degree of vacuum in the processing chamber 13.

Next, a process for taking out the compensating ring 23, which is included in the first embodiment of the semiconductor device manufacturing method in accordance with the present invention, will be will be described with reference to FIGS. 8 and 9.

Figure 8:
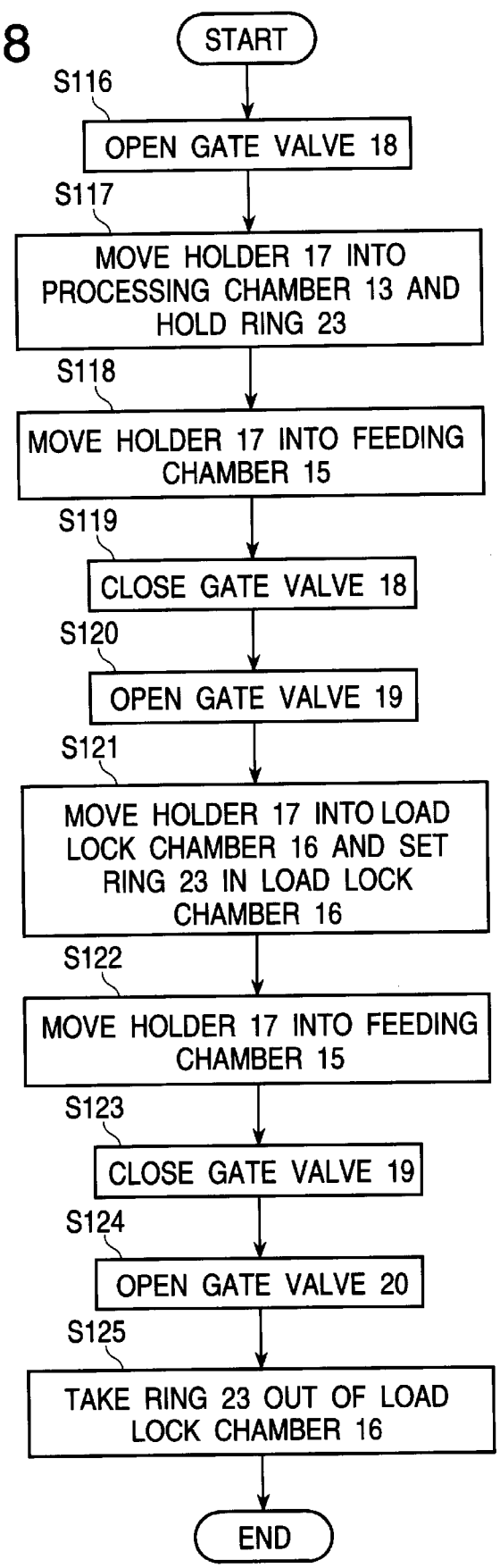
FIG. 8 is a flow chart illustrating a process for taking out the compensating ring, in the first embodiment of the semiconductor device manufacturing method in accordance with the present invention.
Figure 9:
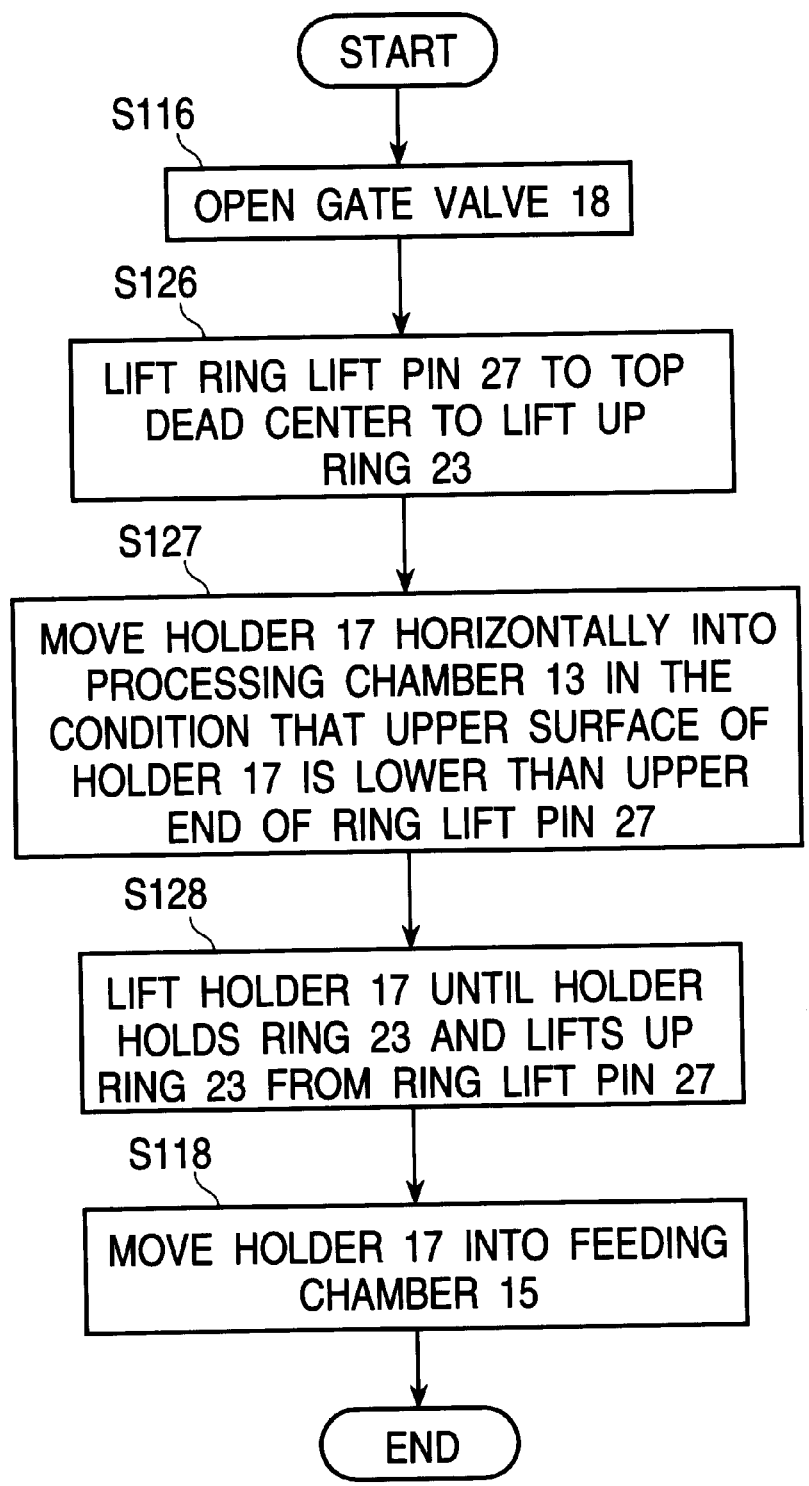
FIG. 9 is a detailed flow chart illustrating the process for taking out the compensating ring.

The process for taking out the compensating ring 23 in the overall system of the manufacturing machine, is conducted as shown in FIG. 8. First, the gate valve 18 is opened (Step S116), and the feeding mechanism 14 is controlled to move the holder 17 into the processing chamber 13 and to handle the compensating ring 23 (namely, to cause the compensating ring 23 to be placed on the holder 17) (Step S117).

The feeding mechanism 14 is further controlled to retract the holder 17 which holds or supports the compensating ring, into the feeding chamber 15 (Step S118). Then, the gate valve 18 is closed (Step S119), and the gate valve 19 is opened (Step S120). Furthermore, the feeding mechanism 14 is controlled to move the holder 17 into the load lock chamber 16 and to set the compensating ring 23 in the load lock chamber 16 (Step S121). Thereafter, the holder 17 which no longer holds the compensating ring 23, is retracted into the feeding chamber 15 (Step S122). The gate valve 19 is closed (Step S123) and the gate valve 20 is opened (Step S124), and then, the compensating ring 23 is taken out from the load lock chamber 16 (Step S125).

Now, a detailed operation from the Step S116 to the Step S118 will be described with reference to the flow chart of FIG. 9.

The gate valve 18 is opened (Step S116), and the compensating ring lift pins 27 is lifted up to the compensating ring delivery position (top dead center) so that the compensating ring 23 is also lifted up to the compensating ring delivery position (Step S126).

The feeding mechanism 14 is controlled to horizontally move the holder 17 at such a level that the upper surface of the holder 17 is lower than the tip end of the compensating ring lift pins 27 which have already been lifted up to the compensating ring delivery position (Step S127). The feeding mechanism 14 is further controlled to lift up the holder 17 until the compensating ring 23 is held by the holder 17 and the compensating ring 23 is lifted from the compensating ring lift pins 27 (Step S128). Then, the feeding mechanism 14 is further controlled to move or retract the holder 17 which holds the compensating ring 23, into the feeding chamber 15 (Step S118). Thus, the compensating ring 23 is taken out from the processing chamber 13 to the feeding chamber 15.

In the above mentioned operation, it is preferred that the step S116 and the step S126 are executed in inverse order, since it is preferred to minimize the open time of the gate valve 18 from the viewpoint of maintaining the degree of vacuum in the processing chamber 13.

In the above mentioned embodiment, the holder 17 is lifted up and lowered down at the time of delivering the compensating ring 23 between the holder 17 and the compensating ring lift pins 27. However, it can be modified to the construction that the feeding mechanism 14 is constructed to move the holder 18 only in a horizontal direction, and on the other hand, the compensating ring lift pins 27 is lifted up and lowered down at the time of delivering the compensating ring 23. In this case, the stroke of the compensating ring lift pins 27 become long, but the construction of the feeding mechanism 14 can be simplified. Therefore, the overall cost of the manufacturing machine can be made inexpensive.

In the shown embodiment, the semiconductor wafer 100 can be delivered to and removed from the processing chamber 13 in accordance with the flow of processing shown in FIGS. 6 to 9, but by considering that the compensating ring 23 is replaced by the semiconductor wafer 100 and the compensating ring lift pins 27 is replaced by the semiconductor wafer lift pins 26. Therefore, an explanation will be omitted for simplification of description.

In addition, when both of the semiconductor wafer 100 and the compensating ring 23 are delivered to and removed from the processing chamber 13, the flow of processing shown in FIGS. 6 to 9 is conducted by considering that the compensating ring 23 is replaced by the compensating ring 23 supporting the semiconductor wafer 100 thereon. Therefore, an explanation will be also omitted for simplification of description.

As briefly mentioned hereinbefore, the compensating ring 23 having a shape and formed of a material which are selected in order to obtain a desired performance of etching to the semiconductor wafer 100, is etched by plasma and deposited with a reaction product. The etching by plasma is easy to occur when the compensating ring 23 is formed of a conductor, and the shape of the compensating ring 23 is damaged or lost dependently upon the time during which the compensating ring 23 is exposed to the plasma. As a result, it becomes impossible to obtain the even etching performance, and therefore, it is necessary to exchange the compensating ring 23 at a constant period. On the other hand, the deposition of the reaction product is occurs easily when a surface temperature of the compensating ring 23 is lower than the other portion, and an etching gas (for example, $CHF_3$) to cause the deposition is used, and the amount of the deposition on the compensating ring 23 increases with the processing time. As a result, the height of the reaction product deposited on the compensating ring 23 becomes higher than the surface of the stage 12, so that it becomes impossible to deliver the semiconductor wafer 100. Therefore, also in this case, it is necessary to exchange the compensating ring 23 at a constant period, or alternatively, to remove the reaction product deposited on the compensating ring 23. In this case, however, it is necessary to exchange the compensating ring 23, because there is a means for suppressing the growth velocity of the reaction product, but there is no means for completely preventing the deposition of the reaction product, as mentioned above.

In any case, the above mentioned embodiment of the present invention can, without bringing the pressure of the processing chamber 13 which is maintained at the predetermined vacuum level, into the atmospheric pressure, namely, without breaking the vacuum condition of the processing chamber 13, take out the compensating ring 23 to be replaced with a new one or to be cleaned, by use of the holder 17 originally configured to hold and deliver the semiconductor wafer 100, to a space external to the manufacturing machine, and then, set a new compensating ring or the compensating ring from which the reaction product is removed, into the processing chamber 13. In addition, a plurality of different etchings can be conducted in the same processing chamber, since a semiconductor wafer and a compensating ring suitable or optimum to an etching of the semiconductor wafer are delivered together into the processing chamber 13, so that the etching processing can be optimized.

EMBODIMENT 2

Now, a second embodiment of the semiconductor device manufacturing machine in accordance with the present invention and a second embodiment of the semiconductor device manufacturing method in accordance with the present invention using the second embodiment of the semiconductor device manufacturing machine will be described.

The second embodiment of the semiconductor device manufacturing machine in accordance with the present invention is that the present invention is applied to a sputtering machine. However, an overall construction of this second embodiment is similar to that of the parallel plate type, single-wafer-processing type, dry etching machine shown in FIG. 1, and therefore, in place of a drawing showing the overall construction of this second embodiment, new Reference Numerals for showing the overall construction of this second embodiment are added to FIG. 1.

Namely, the second embodiment includes a stage 32, a processing chamber 33, a feeding mechanism 34, a feeding chamber 35, a load lock chamber 36, a holder 37 and gate valves 38 to 40, which are similar to corresponding ones of the prior art example. However, as shown in FIGS. 10 and 11, the processing chamber 33 and the holder 37 are different in a detailed construction from those of the processing chamber 73 and the holder 77 of the prior art shown in FIGS. 2 and 3.

Figure 10:
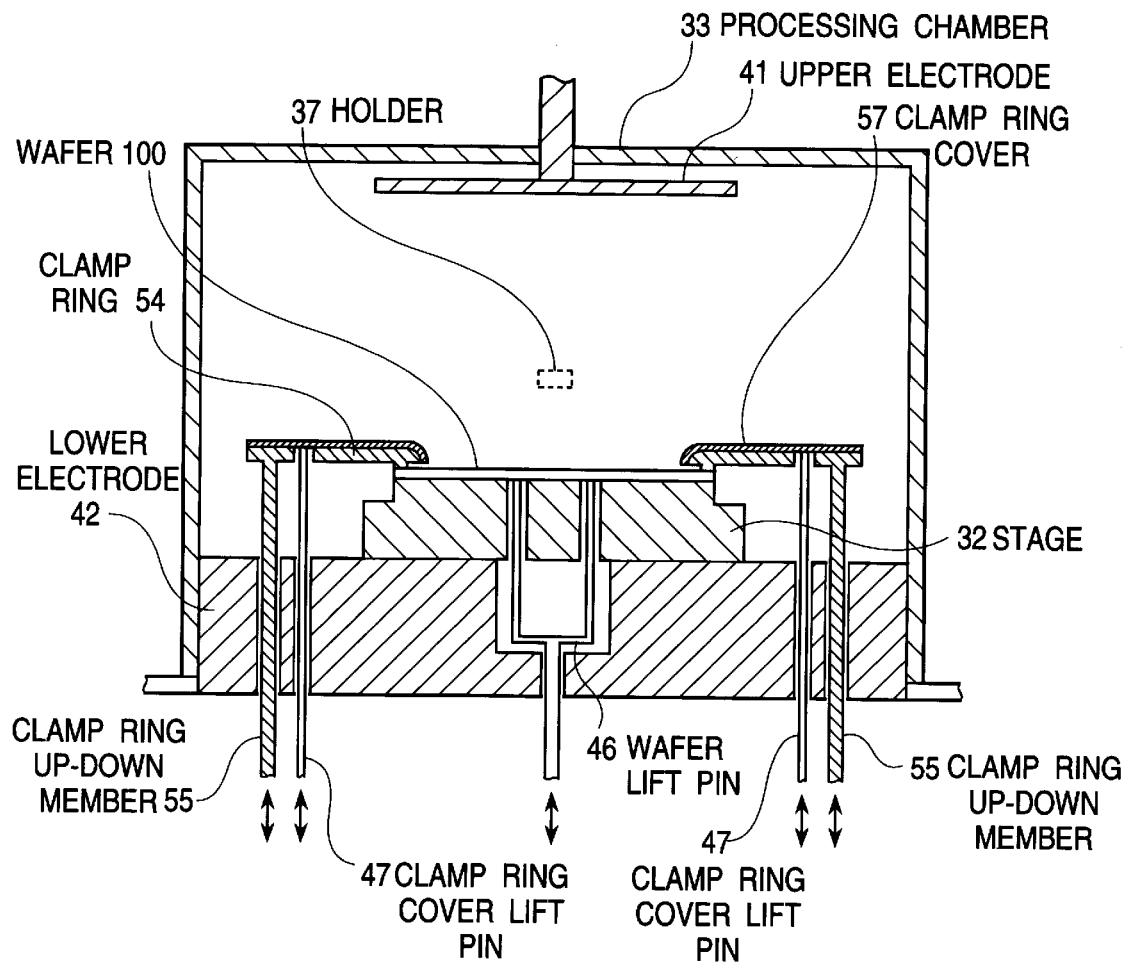
FIG. 10 is a diagrammatic sectional view of the processing chamber of a second embodiment of the semiconductor device manufacturing machine in accordance with the present invention.
Figure 11:
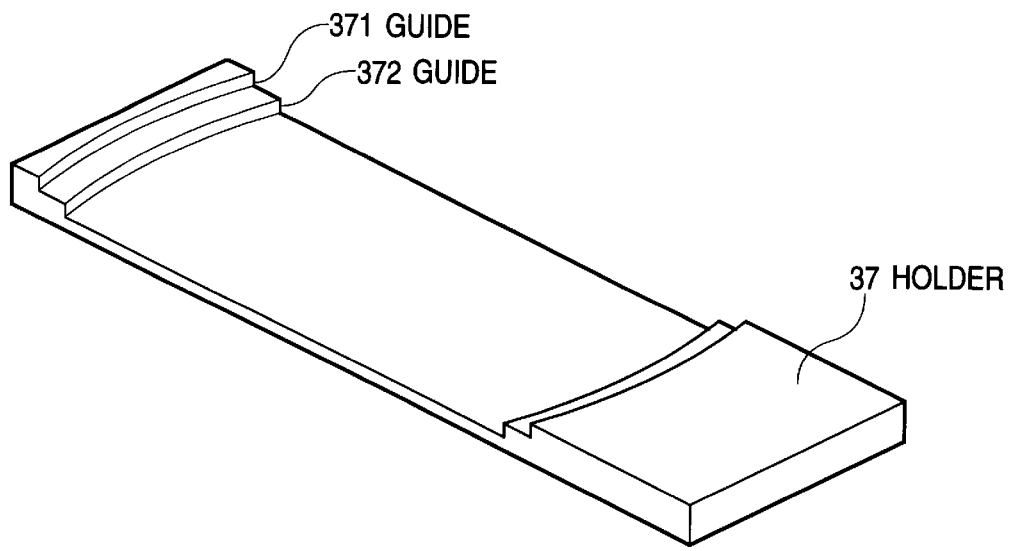
FIG. 11 is a diagrammatic perspective view of the holder provided to the feeding mechanism in the second embodiment of the semiconductor device manufacturing machine in accordance with the present invention.

The processing chamber 33 as shown in FIG. 10 comprises an upper electrode (target) 41 and a lower electrode 42 which are located separately from each other in a vertical direction for carrying out a predetermined processing to a semiconductor wafer 100 placed on the stage 32, which is located on the lower electrode 42. A clamp ring 54 is provided for the purpose of immovably setting the semiconductor wafer 100 on the stage 32 which is temperature-controlled, so that the temperature of the semiconductor wafer 100 is maintained at a constant level and the semiconductor wafer 100 is prevented from deviating from a proper position. Clamp ring up-down members 55 are provided to extend through the lower electrode 42 and have their tip end fixed to a periphery of the clamp ring 54 so as to support the clamp ring 54 by their tip end. When the semiconductor wafer 100 is immovably set to the stage 32, these clamp ring up-down members 55 are lowered to such a position (bottom dead center) that the clamp ring 54 is brought into contact with the semiconductor wafer 100 with a predetermined contact pressure. When the semiconductor wafer 100 is to be removed from the stage 32, these clamp ring up-down members 55 are lifted to such a position (top dead center) that when semiconductor wafer lift pins 46 explained hereinafter are lifted to their top dead center, the clamp ring 54 no longer contacts with a surface of the semiconductor wafer 100.

A plurality of semiconductor wafer lift pins 46 are provided to extend through the lower electrode 42 and the stage 32 so as to support the semiconductor wafer by their tip end, and are constructed to be vertically driven up and down. When the predetermined processing is conducted to the semiconductor wafer 100, the semiconductor wafer lift pins 46 are lowered to such a position (bottom dead center) that the tip end of the semiconductor wafer lift pins 46 does not protrude from an upper surface of the stage 32. When the semiconductor wafer 100 is to be put on or removed from the stage 32, the semiconductor wafer lift pins 46 are vertically lifted to such a position (top dead center) that the tip end of the semiconductor wafer lift pins 46 becomes higher than a top surface of the holder 37 which is horizontally moved toward a position above the stage 32.

There is provided a clamp ring cover 57, which covers an upper surface of the clamp ring 54 and is put on the clamp ring by only a weight of the clamp ring cover 57 itself. Furthermore, a plurality of clamp ring cover lift pins 47 are also provided to extend through the lower electrode 42 and the clamp ring 54 so as to support only the clamp ring cover 57 by their tip end and are constructed to be vertically driven up and down. When the predetermined processing is conducted to the semiconductor wafer 100, the clamp ring cover lift pins 47 are lowered to such a position (bottom dead center) that when the clamp ring up-down members 55 are at their bottom dead center, the tip ends of the clamp ring cover lift pins 47 have no influence on a position of the clamp ring cover 57 put on the clamp ring 54. When the clamp ring cover 57 is to be put on or removed from the processing chamber 33, the clamp ring cover lift pins 47 are lifted to such a position (top dead center) that the tip end of the clamp ring cover lift pins 47 is higher than the upper surface of the holder 37 which is horizontally moved toward a position above the stage 32.

Figure 12A:
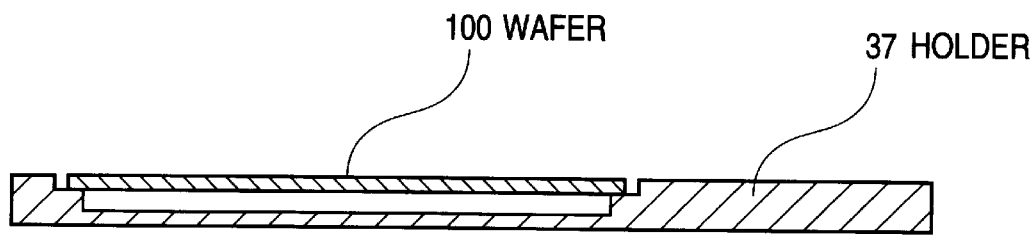
FIGS. 12A and 12B illustrate two different conditions of the holder provided to the feeding mechanism in the second embodiment of the semiconductor device manufacturing machine in accordance with the present invention.
Figure 12B:
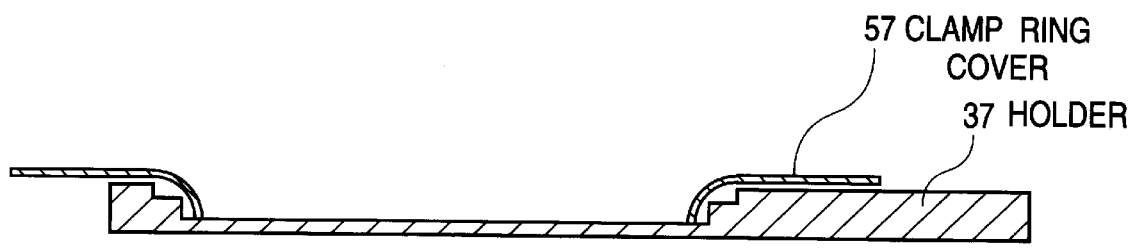

The holder 37 is controlled by the feeding mechanism 34 to move horizontally between adjacent chambers, similarly to the prior art example and the first embodiment. In addition, as shown in FIG. 11, the holder 37 includes semiconductor wafer holding guides 371 (which define a first recess) for preventing the semiconductor wafer 100 put on the holder 37 from deviating from a proper position, when the semiconductor wafer is held as shown in FIG. 12A. The holder 37 also includes clamp ring cover holding guides 372 (which define a second recess which is deeper and smaller than the first recess and which has a center axis common to the first recess) for preventing the clamp ring cover 57 put on the holder 37 from deviating from a proper position, when the clamp ring cover 57 is held as shown in FIG. 12B.

Now, a process for setting and removing the clamp ring cover 57, which is included in a second embodiment of the semiconductor device manufacturing method in accordance with the present invention, will be described with reference to FIGS. 1, 10, 11, 12A and 12B and flow charts of FIGS. 13 to 16.

The process for setting the clamp ring cover 57 in the overall system of the manufacturing machine, is conducted as shown in FIG. 13. First, the gate valve 40 is opened (Step S129), and the clamp ring cover 57 is set in the load lock chamber 36 (Step S130). Thereafter, the gate valve 40 is closed (Step S131), and then, the gate valve 39 is opened (Step S132). The holder 37 is moved into the load lock chamber 36 to hold the clamp ring cover 57 (Step S133). Furthermore, the holder 37 holding the clamp ring cover 57 is retracted into the feeding chamber 35 (Step S134), and the gate valve 39 is closed (Step S135). The feeding chamber 35 is evacuated to a predetermined vacuum level (Step S136), and then, the gate valve 38 is opened (Step S137). The holder 37 holding the clamp ring cover 57 is moved into the processing chamber 33 (Step S138), and the clamp ring cover 57 is set on the clamp ring 54 (Step S139). Thereafter, the holder 37, which no longer holds the clamp ring cover 57, is retracted into the feeding chamber 35 (Step S140), and the gate valve 38 is closed (Step S141). Thus, the setting of the clamp ring cover 57 is completed.

Figure 14:
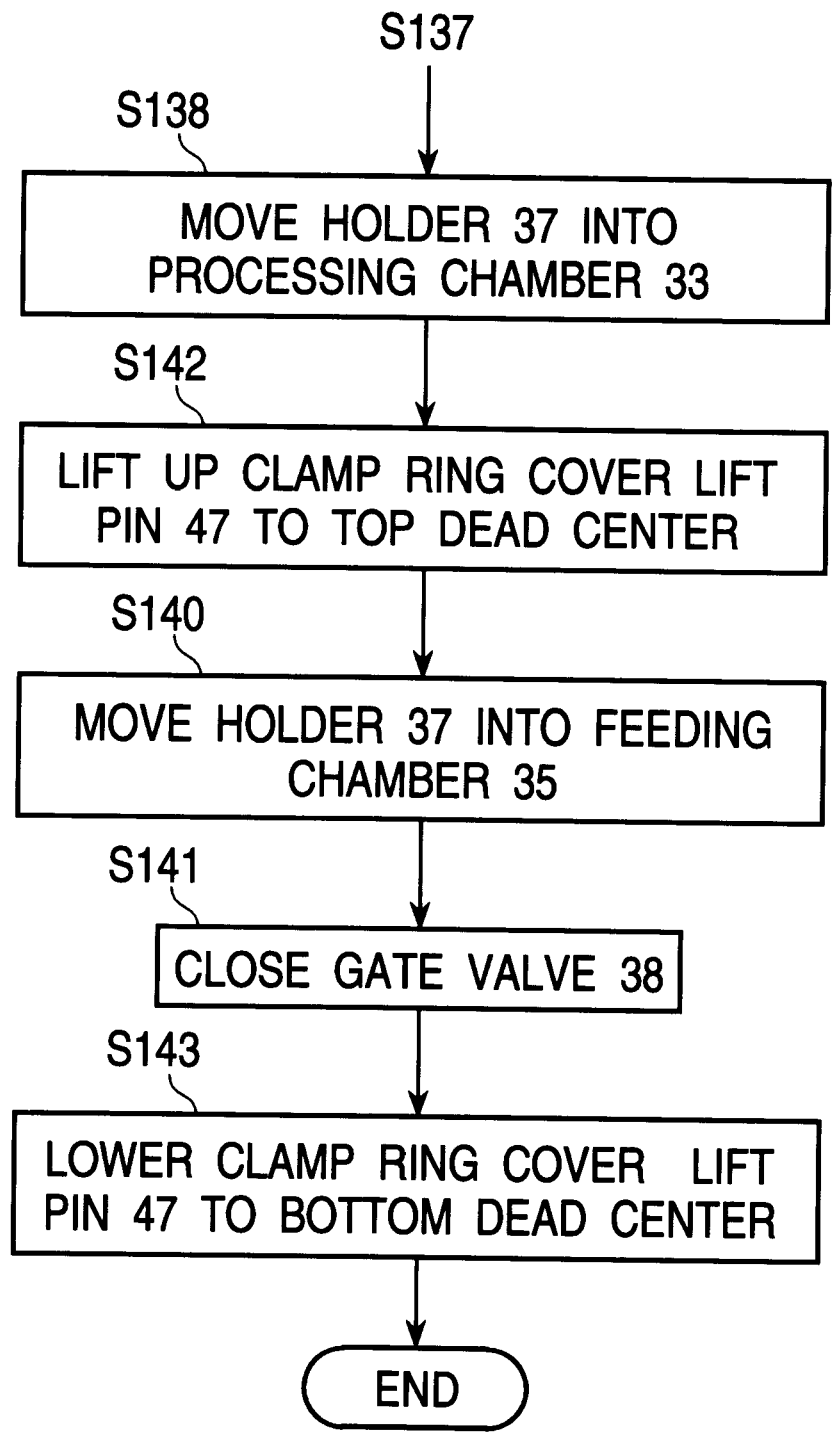
FIG. 14 is a detailed flow chart illustrating the process for setting the clamp ring cover.

Now, a detailed operation from the Step S138 to the Step S141 will be described with reference to the flow chart of FIG. 14.

After the holder 37 holding the clamp ring cover 57 is moved into the processing chamber 33 (Step S138), the clamp ring cover lift pins 47 are lifted to their top dead center to support and lift up the clamp ring cover 57 from the clamp ring cover holding guides 372 of the holder 37 (Step S142). Thereafter, the holder 37 on which the clamp ring cover 57 no longer exists, is retracted to the feeding chamber 35 (Step S140), and the gate valve 38 is closed (Step S141). On the other hand, the clamp ring cover lift pins 47, which support the clamp ring cover 57 by their tip end, are lowered to their bottom dead center, so that the clamp ring cover 57 is set in a predetermined position on the clamp ring 54 (Step S143). In this operation, the Step S141 and the Step S143 can be executed in inverse order.

Figure 15:
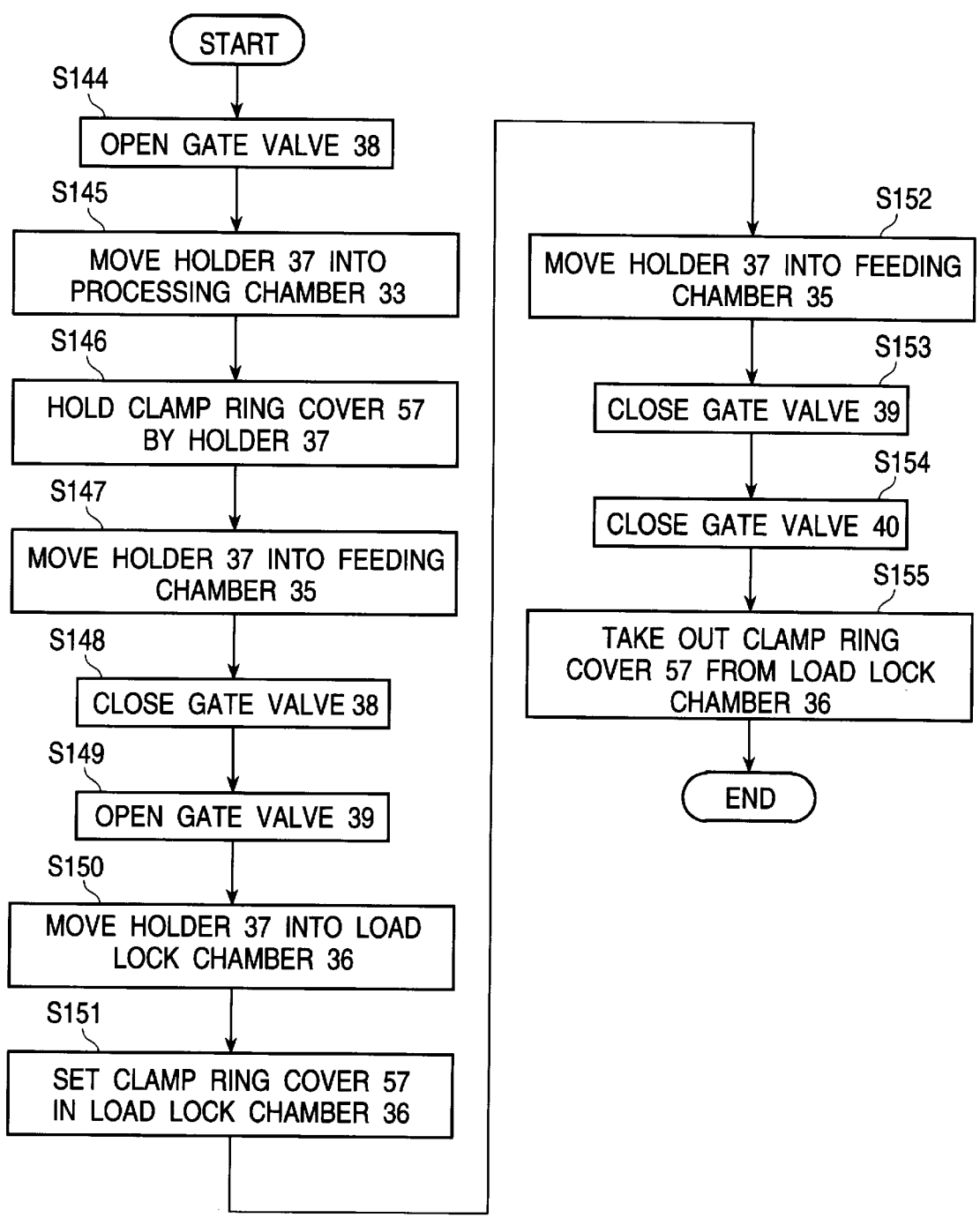
FIG. 15 is a flow chart illustrating a process for taking out the clamp ring cover, in the second embodiment of the semiconductor device manufacturing method in accordance with the present invention.

Next, the process for taking out the clamp ring cover 57 in the overall system of the manufacturing machine, is conducted as shown in FIG. 15.

First, the gate valve 38 is opened (Step S144) and the holder 37 is moved into the processing chamber 33 (Step S145). The holder 37 is controlled to hold the clamp ring cover 57 (Step S146), and the holder 37 holding the clamp ring cover 57 is retracted into the feeding chamber 35 (Step S147). The gate valve 38 is closed (Step S148) and then the gate valve 39 is opened (Step S149). The holder 37 holding the clamp ring cover 57 is moved into the load lock chamber 36 (Step S150), and the clamp ring cover 57 is set in the load lock chamber 36 (Step S151). Thereafter, the holder 37 which no longer holds the clamp ring cover 57 is retracted into the feeding chamber 35 (Step S152). The gate valve 39 is closed (Step S153), and then, the gate valve 40 is opened (Step S154), so that the clamp ring cover 57 can be taken out from the load lock chamber 36 (Step S155).

Figure 16:
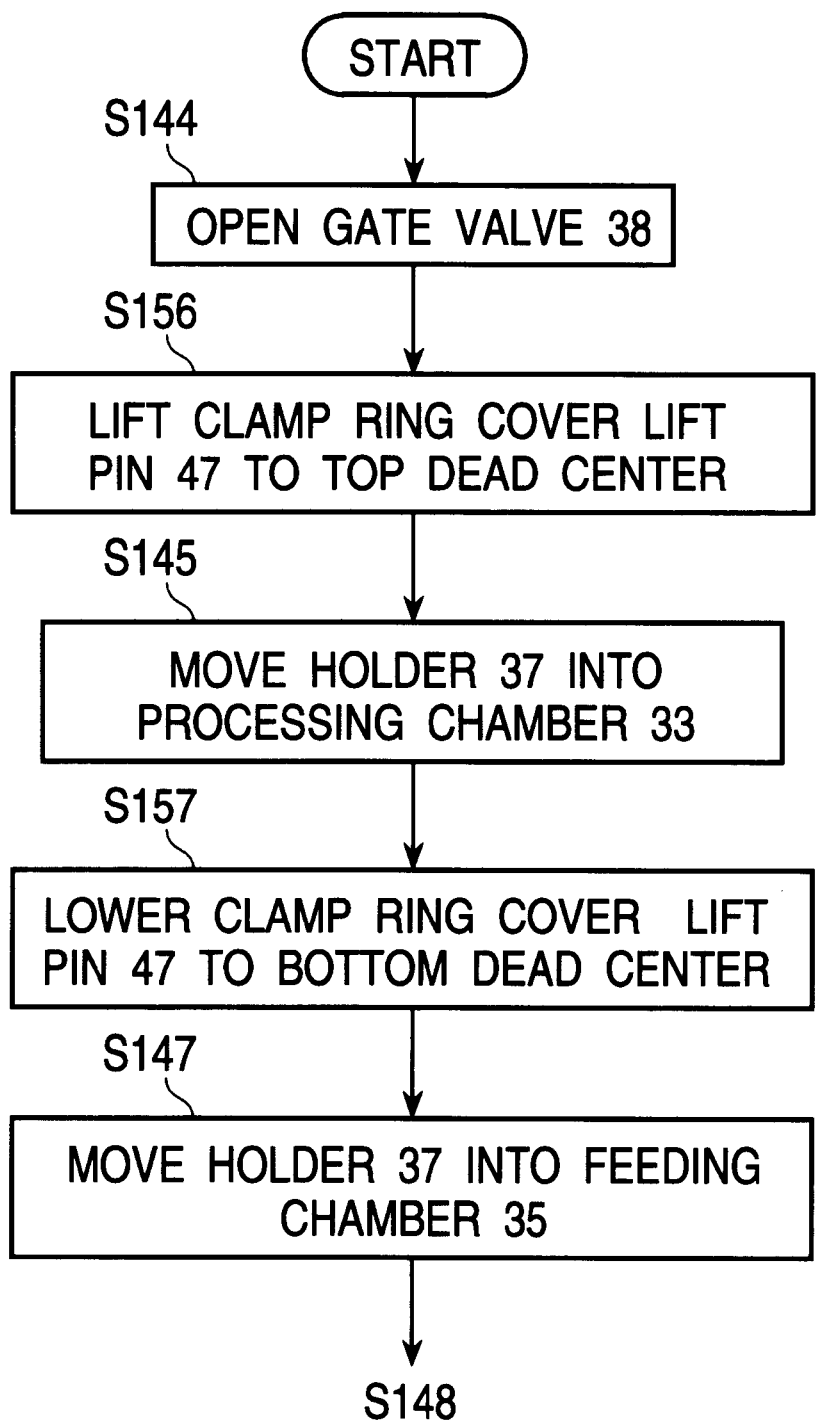
FIG. 16 is a detailed flow chart illustrating the process for taking out the clamp ring cover.

Now, a detailed operation from the Step S144 to the Step S147 will be described with reference to the flow chart of FIG. 16.

After the gate valve 38 is opened (Step S144), the clamp ring cover lift pins 47 are lifted to the top dead center, so that the clamp ring cover 57 put on the clamp ring 54 is lifted from the clamp ring 54 by the tip end of the clamp ring cover lift pins 47 (Step S156). Then, the holder 37 is moved into the processing chamber 33 (Step S145), and the clamp ring cover lift pins 47 are lowered to the bottom dead center, so that the clamp ring cover 57 is transferred from the tip end of the clamp ring cover lift pins 47 to the clamp ring cover holding guides 372 of the holder 37 (Step S157). Thereafter, the holder 37 holding the clamp ring cover 57 is retracted into the feeding chamber 35 (Step S147). Thus, the clamp ring cover 57 located in place on the clamp ring 54 has been removed from the processing chamber 33. Here, the Step S144 and the Step S156 can be executed in inverse order.

In the above mentioned embodiment, at the time of delivering the clamp ring cover 57 between the holder and the clamp ring cover lift pins 47, the clamp ring cover lift pins 47 are lifted and lowered without moving the holder 37. However, it can be modified to such a construction that, without moving the clamp ring cover lift pins 47, the holder 37 is lifted and lowered to deliver the clamp ring cover 57.

The overall process for sputtering the semiconductor wafer 100 in the sputtering machine of the second embodiment, is the same as the process shown in FIGS. 13 and 15, if the clamp ring cover 57 is replaced by the semiconductor wafer 100. Therefore, an overall explanation will be omitted for simplification of description, but only a detailed process conducted in the processing chamber 33 will be described with reference to FIG. 17.

First, the clamp ring up-down member 55 is lifted to the top dead center (Step S158), and the holder 37 holding the semiconductor wafer 100 between the semiconductor wafer holding guides 371 is moved to the processing chamber 33 (Step S159). In this condition, the semiconductor wafer lift pins 46 are lifted to the top dead center, so that the semiconductor wafer 100 is transferred from the holder 37 to the tip ends of the semiconductor wafer lift pins 36 (Step S160). The holder 37, on which the semiconductor wafer no longer exists, is retracted into the feeding chamber 35 (Step S161) and the gate valve 38 is closed (Step S162).

Thereafter, the semiconductor wafer lift pins 46 are lowered to the bottom dead center, so that the semiconductor wafer 100 supported by the tip ends of the semiconductor wafer lift pins 46 is set on the stage 32 (Step S163). Then, the clamp ring up-down member 55 is lowered to the bottom dead center, so that the semiconductor wafer 100 is immovably secured on the stage 32 (Step S164) by the clamp ring 54. In this condition, a predetermined process (sputtering) is executed (Step S165).

After the predetermined process is completed, the clamp ring up-down member 55 is lifted to the top dead center, so that the semiconductor wafer 100 is on the stage 32 due to only the weight of the semiconductor wafer 100 itself (Step S166). Then, the semiconductor wafer lift pins 46 are lifted to the top dead center, so that the semiconductor wafer 100 is supported by the tip ends of the semiconductor wafer lift pins 36 (Step S167). The gate valve 38 is opened (Step S168) and the holder 37 is moved into the processing chamber 33 (Step S169).

Thereafter, the semiconductor wafer lift pins 46 are lowered to the bottom dead center, so that the semiconductor wafer 100 which was supported by the tip ends of the semiconductor wafer lift pins 46 is transferred to the semiconductor wafer holding guides 371 of the holder 37 (Step S170). The holder 37 holding the semiconductor wafer 100 is retracted into the feeding chamber 35 (Step S171), and the gate valve 38 is closed (Step S172). Then, the clamp ring up-down member 55 is lowered to the bottom dead center (Step) S173). Thus, a series of processes conducted in the processing chamber 33 are completed.

The above mentioned second embodiment is realized in the sputtering machine, but a fundamentally similar embodiment can be realized in the parallel plate type, single-wafer-processing type, dry etching machine. Therefore, the second embodiment can be applied to the parallel plate type, single-wafer-processing type, dry etching machine.

In a film forming sputtering machine such as the second embodiment, a deposited film is formed not only on the surface of the semiconductor wafer but also on the clamp ring cover. The thickness of the deposited film increases with the processing time, so that the deposited film often peels off and adheres to the surface of the semiconductor wafer, or alternatively, becomes an obstacle to deposition of the film on a peripheral region of the semiconductor wafer so that the thickness of the film deposited on the peripheral region of the semiconductor wafer becomes smaller than that of the film deposited on a central region of the semiconductor wafer. Therefore, it is necessary to exchange the clamp ring cover periodically. In addition, in the case of the dry etching, if the reaction product deposits on the clamp ring cover, it is also necessary to exchange the clamp ring cover periodically. The second embodiment can exchange the clamp ring cover without bringing the processing chamber maintained at the predetermined vacuum level, into an atmospheric pressure, namely without breaking the vacuum condition of the processing chamber.

As seen from the above, the semiconductor device manufacturing machine in accordance with the present invention comprises a ring-like peripheral member lifting mechanism for lifting up a ring-like peripheral member and a holder provided at a tip end of a feeding mechanism and capable of holding either or both of a semiconductor wafer and the peripheral member, so that the peripheral member is lifted up by the lifting mechanism and transferred to the holder of the feeding mechanism, and the peripheral member held by the holder of the feeding mechanism is moved to a load lock chamber and further can be taken out to an external of the semiconductor device manufacturing machine. In this construction, since the peripheral member, which is located near to the semiconductor wafer within a processing chamber and which is therefore required to be exchanged periodically, is held and transferred by the holder for holding and transferring the semiconductor wafer, the peripheral member can be exchanged without breaking the vacuum condition of the processing chamber, namely without bringing the processing chamber maintained at the predetermined vacuum level into an atmospheric pressure. As mentioned hereinbefore, in the prior art, in order to exchange a member which is located near to the semiconductor wafer within a processing chamber and which is therefore required to be exchanged periodically, it was necessary to bring the processing chamber maintained at the predetermined vacuum level into an atmospheric pressure, before exchange of the member, and to return the processing chamber to the predetermined vacuum level after exchange of the member. Therefore, the present invention can be remarkably elevate the operating efficiency of the semiconductor device manufacturing machine.

The following is specific advantages obtained by the semiconductor device manufacturing machine and method in accordance with the present invention.

In the parallel plate type, single-wafer-processing, type, dry etching machine, the exchange or cleaning of the compensating ring is practically conducted every two days when the frequency of exchange or cleaning is relatively high. In the prior art, about a half day was required for this exchange of the compensating ring. However, according to the present invention, the exchanging operation can be shortened to about one minute. In addition, in a film deposition machine such as a sputtering machine, the exchange of the clamp ring was practically conducted every three days. In the prior art, the exchange of the clamp ring required about a half day. However, according to the present invention, it is no longer necessary to exchange the clamp ring itself, and the exchange of the clamp ring cover can be executed about one minute.

Accordingly, in the prior art, the exchange of the ring-like peripheral member is the largest cause for reduced actual operating efficiency of the semiconductor device manufacturing machine. This problem can be overcome by the present invention, and therefore, the operating efficiency of the semiconductor device manufacturing machine can be remarkably elevated.

In addition, in the parallel plate type, single-wafer-processing type, dry etching machine, the compensating ring which was fixed in the prior art, can be changed for each semiconductor wafer according to the present invention. Therefore, it is possible to use a compensating ring optimum to the etching process to be actually executed, so that the etching processing for the semiconductor wafer becomes easy. Therefore, the yield of production and reliability of the semiconductor device can be elevated.

The invention has thus been shown and described with reference to the specific embodiments. However, it should be noted that the present invention is in no way limited to the details of the illustrated structures but changes and modifications may be made within the scope of the appended claims.

We claim:

1. A semiconductor device manufacturing machine comprising:

a processing chamber for processing semiconductor wafers;

a feeding chamber affixed to said processing chamber;

a load lock chamber affixed to said feeding chamber;

a feeding mechanism within said feeding chamber for feeding a semiconductor wafer between said processing chamber and said load lock chamber;

a semiconductor wafer lift-up mechanism, for lifting up a semiconductor wafer which is within the processing chamber;

a peripheral member within said processing chamber at least partially surrounding a semiconductor wafer;

a peripheral member lift-up mechanism within said processing chamber, for lifting up said peripheral member; and a holding member extending from said feeding mechanism and capable of selectively holding only said semiconductor wafer, only said peripheral member, and both said semiconductor wafer and said peripheral member, whereby said holding member can selectively transfer either said semiconductor wafer by itself, said peripheral member by itself, and both said semiconductor wafer and said peripheral member together, to said load lock chamber and then to a space external to the semiconductor device manufacturing machine.

2. A semiconductor device manufacturing machine claimed in claim 1 wherein the semiconductor device manufacturing machine is a parallel plate, single-wafer-processing, dry etching machine, and said peripheral member is a compensating ring for compensating the evenness of etching.

3. A semiconductor device manufacturing machine claimed in claim 1 wherein the semiconductor device manufacturing machine is a sputtering machine or a chemical vapor deposition machine, and said peripheral member is a clamp ring cover for covering an upper surface of a clamp ring which holds said semiconductor wafer in within said processing chamber.

* * * * *

UNITED STATES PATENT AND TRADEMARK OFFICE
CERTIFICATE OF CORRECTION

PATENT NO. : 6,044,534
DATED : April 4, 2000
INVENTOR(S) : Hirofumi SEO, Shinichi HIRAMATSU It is certified that error appears in the above-indentified patent and that said Letters Patent is hereby corrected as shown below:

In the Abstract, last line, after "chamber.", insert --Therefore the operating efficiency of the semiconductor device manufacturing machine can be remarkably elevated--.

Signed and Sealed this

Twentieth Day of March, 2001

Attest:

NICHOLAS P. GODICI

*Attesting Officer*    *Acting Director of the United States Patent and Trademark Office*